United States Patent
Larsen, III et al.

(10) Patent No.: US 11,211,228 B1
(45) Date of Patent: *Dec. 28, 2021

(54) NEUTRAL RADICAL ETCHING OF DIELECTRIC SACRIFICIAL MATERIAL FROM REENTRANT MULTI-LAYER METAL STRUCTURES

(71) Applicant: Microfabrica Inc., Van Nuys, CA (US)

(72) Inventors: Rulon J. Larsen, III, Colorado Springs, CO (US); Adam L. Cohen, Dallas, TX (US)

(73) Assignee: Microfabrica Inc., Van Nuys, CA (US)

( * ) Notice: Subject to any disclaimer, the term of this patent is extended or adjusted under 35 U.S.C. 154(b) by 200 days.

This patent is subject to a terminal disclaimer.

(21) Appl. No.: 16/380,159

(22) Filed: Apr. 10, 2019

Related U.S. Application Data

(60) Continuation of application No. 15/206,782, filed on Jul. 11, 2016, now Pat. No. 10,297,421, which is a
(Continued)

(51) Int. Cl.
*H01J 37/32* (2006.01)
*C25D 5/10* (2006.01)
(Continued)

(52) U.S. Cl.
CPC ........ *H01J 37/32009* (2013.01); *C25D 1/003* (2013.01); *C25D 1/20* (2013.01);
(Continued)

(58) Field of Classification Search
None
See application file for complete search history.

(56) References Cited

U.S. PATENT DOCUMENTS 2,178,299 A 10/1939 Dallenbach
2,306,082 A 12/1942 Prest
(Continued)

FOREIGN PATENT DOCUMENTS

DE 3212152 A1 10/1983
EP 0313058 B1 2/1995
(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.
(Continued)

*Primary Examiner* — Louis J Rufo
(74) *Attorney, Agent, or Firm* — Dennis R. Smalley

(57) ABSTRACT

Embodiments are directed to forming reentrant multi-layer micro-scale or millimeter scale three dimensional structures, parts, components, or devices where each layer is formed from a plurality of deposited materials and more specifically where each layer is formed from at least one metal structural material and at least one organic sacrificial material (e.g. polymer) that are co-planarized and a portion of the sacrificial material located on a plurality of layers is removed after formation of the plurality of layers via one or more plasma etching operations or one or more neutral radical etching operations.

20 Claims, 9 Drawing Sheets

Related U.S. Application Data continuation-in-part of application No. 14/676,716, filed on Apr. 1, 2015, now abandoned, which is a continuation of application No. 14/203,409, filed on Mar. 10, 2014, now abandoned, which is a continuation of application No. 13/206,133, filed on Sep. 8, 2011, now abandoned, which is a continuation of application No. 12/479,638, filed on Jun. 5, 2009, now abandoned, which is a division of application No. 10/841,272, filed on May 7, 2004, now abandoned.

(60) Provisional application No. 62/194,054, filed on Jul. 17, 2015, provisional application No. 60/474,625, filed on May 29, 2003, provisional application No. 60/468,741, filed on May 7, 2003.

(51) Int. Cl.
*C25D 5/48* (2006.01)
*C25D 7/12* (2006.01)
*C25D 1/20* (2006.01)
*C25D 1/00* (2006.01)

(52) U.S. Cl.
CPC ............... *C25D 5/10* (2013.01); *C25D 5/48* (2013.01); *C25D 7/123* (2013.01); *H01J 37/3244* (2013.01); *H01J 2237/334* (2013.01)

(56) References Cited

U.S. PATENT DOCUMENTS

| | | | |
|---|---|---|---|
| 2,438,913 | A | 4/1948 | Hansen |
| 2,532,993 | A | 12/1950 | Carter |
| 2,976,534 | A | 3/1961 | Kampinsky |
| 3,144,624 | A | 8/1964 | Rypinski, Jr. |
| 3,160,826 | A | 12/1964 | Marcatili |
| 3,185,944 | A | 5/1965 | Turnage et al. |
| 3,240,685 | A | 3/1966 | Maissel |
| 3,602,848 | A | 8/1971 | Leonard |
| 3,697,401 | A | 10/1972 | Lucas et al. |
| 3,729,740 | A | 4/1973 | Nakahara et al. |
| 3,745,105 | A | 7/1973 | Kosowsky et al. |
| 3,824,504 | A | 7/1974 | Parris |
| 3,835,017 | A | 9/1974 | Mentone et al. |
| 3,900,693 | A | 8/1975 | Wyhof |
| 3,909,755 | A | 9/1975 | Kaunzinger |
| 3,926,916 | A | 12/1975 | Mastrangelo |
| 3,963,999 | A | 6/1976 | Nakajima et al. |
| 4,021,789 | A | 5/1977 | Furman et al. |
| 4,043,891 | A | 8/1977 | Alkire et al. |
| 4,058,432 | A | 11/1977 | Schuster-Woldan et al. |
| 4,065,374 | A | 12/1977 | Asami et al. |
| 4,080,267 | A | 3/1978 | Castellani et al. |
| 4,126,533 | A | 11/1978 | Lukyanchikov et al. |
| 4,127,831 | A | 11/1978 | Riblet |
| 4,155,815 | A | 5/1979 | Francis et al. |
| 4,161,704 | A | 7/1979 | Schafer |
| 4,187,553 | A | 2/1980 | Ahn et al. |
| 4,294,669 | A | 10/1981 | Lincoln et al. |
| 4,370,941 | A | 2/1983 | Belton |
| 4,376,017 | A | 3/1983 | Urion |
| 4,404,080 | A | 9/1983 | Jahani |
| 4,452,684 | A | 6/1984 | Palnik |
| 4,537,647 | A | 8/1985 | Foster |
| 4,575,330 | A | 3/1986 | Hull |
| 4,600,555 | A | 7/1986 | Shimizu |
| 4,614,922 | A | 9/1986 | Bauman et al. |
| 4,647,878 | A | 3/1987 | Landis et al. |
| 4,670,724 | A | 6/1987 | Riblet et al. |
| 4,673,904 | A | 6/1987 | Landis |
| 4,752,352 | A | 6/1988 | Feygin |
| 4,764,449 | A | 8/1988 | Vanlseghem |
| 4,770,754 | A | 9/1988 | Meuldijk et al. |
| 4,776,087 | A | 10/1988 | Cronin et al. |
| 4,810,982 | A | 3/1989 | Wong |
| 4,816,618 | A | 3/1989 | Bongianni |
| 4,920,639 | A | 5/1990 | Yee |
| 4,921,583 | A | 5/1990 | Sewell et al. |
| 4,954,192 | A | 9/1990 | Dziekan |
| 4,958,222 | A | 9/1990 | Takakura et al. |
| 4,961,154 | A | 10/1990 | Pomerantz et al. |
| 4,985,116 | A | 1/1991 | Mettler et al. |
| 5,011,580 | A | 4/1991 | Pan et al. |
| 5,059,359 | A | 10/1991 | Hull et al. |
| 5,160,404 | A * | 11/1992 | Motoyama ........ H01L 21/31138 216/47 |
| 5,190,637 | A | 3/1993 | Guckel |
| 5,209,817 | A | 5/1993 | Ahmad et al. |
| 5,209,878 | A | 5/1993 | Smalley et al. |
| 5,242,861 | A | 9/1993 | Inaba |
| 5,271,822 | A | 12/1993 | Nolan et al. |
| 5,273,691 | A | 12/1993 | Hull et al. |
| 5,298,687 | A | 3/1994 | Rapoport et al. |
| 5,301,415 | A | 4/1994 | Prinz et al. |
| 5,369,881 | A | 12/1994 | Inaba et al. |
| 5,378,583 | A | 1/1995 | Guckel et al. |
| 5,395,508 | A | 3/1995 | Jolly et al. |
| 5,413,668 | A | 5/1995 | Aslam et al. |
| 5,426,399 | A | 6/1995 | Matsubayashi et al. |
| 5,435,902 | A | 7/1995 | Andre |
| 5,455,545 | A | 10/1995 | Garcia |
| 5,478,699 | A | 12/1995 | Blessington et al. |
| 5,496,668 | A | 3/1996 | Guckel et al. |
| 5,501,784 | A | 3/1996 | Ilmann et al. |
| 5,512,162 | A | 4/1996 | Sachs et al. |
| 5,512,163 | A | 4/1996 | Warfield |
| 5,545,593 | A | 8/1996 | Watkins et al. |
| 5,560,837 | A | 10/1996 | Trueba |
| 5,576,147 | A | 11/1996 | Guckel et al. |
| 5,596,504 | A | 1/1997 | Tata et al. |
| 5,605,614 | A | 2/1997 | Bomand |
| 5,605,615 | A | 2/1997 | Goolsby et al. |
| 5,614,075 | A | 3/1997 | Andre |
| 5,641,391 | A | 6/1997 | Hunter et al. |
| 5,652,557 | A | 7/1997 | Ishikawa |
| 5,685,491 | A | 11/1997 | Marks et al. |
| 5,700,607 | A | 12/1997 | Rath et al. |
| 5,718,618 | A * | 2/1998 | Guckel ............... B24B 37/04 216/89 |
| 5,766,441 | A | 6/1998 | Arndt et al. |
| 5,805,971 | A | 9/1998 | Akedo |
| 5,832,834 | A | 11/1998 | Nishino et al. |
| 5,865,978 | A | 2/1999 | Cohen |
| 5,866,281 | A | 2/1999 | Guckel et al. |
| 5,874,011 | A | 2/1999 | Ehrlich |
| 5,876,424 | A | 3/1999 | Michael |
| 5,902,493 | A * | 5/1999 | Bae ............... G03F 7/095 216/13 |
| 5,908,719 | A | 6/1999 | Guckel et al. |
| 5,945,058 | A | 8/1999 | Manners et al. |
| 5,999,184 | A | 12/1999 | Smalley et al. |
| 6,008,102 | A | 12/1999 | Alford et al. |
| 6,019,784 | A * | 2/2000 | Hines ............... C25D 1/00 128/898 |
| 6,027,630 | A * | 2/2000 | Cohen ............... B81C 1/00126 205/135 |
| 6,029,096 | A | 2/2000 | Manners et al. |
| 6,140,888 | A | 10/2000 | Sarkka et al. |
| 6,197,180 | B1 | 3/2001 | Kelly |
| 6,218,846 | B1 | 4/2001 | Ludwig et al. |
| 6,277,759 | B1 * | 8/2001 | Blalock ............. H01J 37/32862 257/E21.252 |
| 6,333,741 | B1 | 12/2001 | Snead et al. |
| 6,338,900 | B1 | 1/2002 | Tada et al. |
| 6,355,147 | B1 | 3/2002 | Griffiths et al. |
| 6,417,742 | B1 | 7/2002 | Enokuma |
| 6,428,673 | B1 | 8/2002 | Ritzdorf et al. |
| 6,458,263 | B1 | 10/2002 | Morales et al. |
| 6,466,112 | B1 | 10/2002 | Kwon et al. |
| 6,468,439 | B1 | 10/2002 | Whitehurst et al. |
| 6,475,369 | B1 | 11/2002 | Cohen |
| 6,480,163 | B1 | 11/2002 | Knop et al. |

(56) References Cited

U.S. PATENT DOCUMENTS

| | | |
|---|---|---|
| 6,523,252 B1 | 2/2003 | Lipponen |
| 6,534,159 B1 | 3/2003 | Newman et al. |
| 6,551,483 B1 | 4/2003 | Mayer et al. |
| 6,569,307 B2 | 5/2003 | Blachier et al. |
| 6,572,742 B1 | 6/2003 | Cohen |
| 6,582,277 B2 | 6/2003 | Korovin |
| 6,613,972 B2 | 9/2003 | Cohen et al. |
| 6,709,562 B1 * | 3/2004 | Andricacos .............. C25D 3/38 205/122 |
| 6,724,277 B2 | 4/2004 | Holden et al. |
| 6,762,237 B2 | 7/2004 | Glatkowski et al. |
| 6,790,377 B1 | 9/2004 | Cohen |
| 7,012,489 B2 | 3/2006 | Sherrer et al. |
| 7,026,697 B2 | 4/2006 | Sherrer |
| 7,029,829 B2 | 4/2006 | Stark et al. |
| 7,109,118 B2 | 9/2006 | Cohen et al. |
| 7,129,163 B2 | 10/2006 | Sherrer et al. |
| 7,160,429 B2 | 1/2007 | Cohen et al. |
| 7,195,989 B2 | 3/2007 | Lockard et al. |
| 7,198,704 B2 | 4/2007 | Cohen et al. |
| 7,229,542 B2 | 6/2007 | Bang |
| 7,235,166 B2 | 6/2007 | Cohen et al. |
| 7,239,219 B2 | 7/2007 | Brown et al. |
| 7,250,101 B2 | 7/2007 | Thompson et al. |
| 7,252,861 B2 | 8/2007 | Smalley |
| 7,259,640 B2 | 8/2007 | Brown et al. |
| 7,288,178 B2 | 10/2007 | Cohen et al. |
| 7,291,254 B2 | 11/2007 | Cohen et al. |
| 7,303,663 B2 | 12/2007 | Cohen et al. |
| 7,351,321 B2 | 4/2008 | Cohen |
| 7,368,044 B2 | 5/2008 | Cohen et al. |
| 7,384,530 B2 | 6/2008 | Cohen et al. |
| 7,430,731 B2 | 9/2008 | Cohen et al. |
| 7,488,686 B2 | 2/2009 | Cohen et al. |
| 7,498,714 B2 | 3/2009 | Lockard et al. |
| 7,501,328 B2 | 3/2009 | Lockard et al. |
| 7,524,427 B2 | 4/2009 | Cohen et al. |
| 7,527,721 B2 | 5/2009 | Lembrikov et al. |
| 7,531,077 B2 | 5/2009 | Cohen et al. |
| 7,611,616 B2 | 11/2009 | Cohen et al. |
| 7,623,935 B2 | 11/2009 | Cohen et al. |
| 7,686,770 B2 | 3/2010 | Cohen |
| 7,696,102 B2 | 4/2010 | Zhang |
| 7,830,228 B2 | 11/2010 | Brown et al. |
| 8,262,916 B1 | 9/2012 | Smalley et al. |
| 2001/0014409 A1 | 8/2001 | Cohen |
| 2003/0000840 A1 | 1/2003 | Kimura et al. |
| 2003/0127336 A1 | 7/2003 | Cohen et al. |
| 2003/0221968 A1 | 12/2003 | Cohen et al. |
| 2003/0222738 A1 | 12/2003 | Brown et al. |
| 2003/0234179 A1 | 12/2003 | Bang |
| 2004/0000489 A1 | 1/2004 | Zhang et al. |
| 2004/0004001 A1 | 1/2004 | Cohen et al. |
| 2004/0004002 A1 | 1/2004 | Thompson et al. |
| 2004/0007468 A1 | 1/2004 | Cohen et al. |
| 2004/0020782 A1 | 2/2004 | Cohen et al. |
| 2004/0028849 A1 | 2/2004 | Stark et al. |
| 2004/0065550 A1 | 4/2004 | Zhang |
| 2004/0065552 A1 | 4/2004 | Cohen |
| 2004/0065553 A1 | 4/2004 | Cohen |
| 2004/0065555 A1 | 4/2004 | Zhang |
| 2004/0134772 A1 | 7/2004 | Cohen et al. |
| 2004/0146650 A1 | 7/2004 | Lockard et al. |
| 2004/0263290 A1 | 12/2004 | Sherrer et al. |
| 2005/0023145 A1 | 2/2005 | Cohen et al. |
| 2005/0029109 A1 | 2/2005 | Zhang et al. |
| 2005/0067292 A1 | 3/2005 | Thompson et al. |
| 2005/0072681 A1 | 4/2005 | Cohen et al. |
| 2005/0202660 A1 | 9/2005 | Cohen et al. |
| 2005/0230261 A1 | 10/2005 | Cohen et al. |
| 2006/0282065 A1 | 12/2006 | Cohen |
| 2007/0158200 A1 | 7/2007 | Cohen et al. |
| 2007/0198038 A1 | 8/2007 | Cohen et al. |
| 2007/0219459 A1 | 9/2007 | Cohen |
| 2007/0265648 A1 | 11/2007 | Cohen |
| 2008/0050524 A1 | 2/2008 | Kumar et al. |
| 2008/0121343 A1 | 5/2008 | Cohen et al. |
| 2009/0194425 A1 | 8/2009 | Cohen et al. |
| 2010/0051466 A1 | 3/2010 | Smalley et al. |

FOREIGN PATENT DOCUMENTS

| | | |
|---|---|---|
| GB | 2127855 A1 | 4/1984 |
| JP | 59191356 A2 | 10/1984 |
| JP | 61210636 A | 9/1986 |
| JP | 62190722 A2 | 8/1987 |
| JP | 63001399 A2 | 1/1988 |
| JP | 63138246 A2 | 6/1988 |
| JP | 01125956 A | 5/1989 |
| JP | 1255682 A2 | 10/1989 |
| JP | 04318187 A2 | 11/1992 |
| JP | 06232217 A | 8/1994 |
| JP | 07022425 A | 1/1995 |
| JP | 08274167 A | 10/1996 |
| JP | 2001142210 A | 5/2001 |
| RU | 2046469 C1 | 10/1995 |
| WO | 198707538 A1 | 12/1987 |
| WO | 199845504 A1 | 10/1998 |
| WO | 200039854 A1 | 7/2000 |
| WO | 2003049514 A2 | 6/2003 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, p. 19/1-19/23.

Bishop, J.A. et al., "Monolithic Coaxial Transmission Lines for mm-wave ICs", High Speed Semiconductor Devices and Circuits, 1991., Proceeding IEEE/Cornell Conference on Advanced Concepts in Ithaca, NY, USA Aug. 5-7, 1991, pp. 252-260.

Hill, Dr. Steve, "An E-FAB Way for Making the Micro World", Materials World is the journal of The Institute of Materials, Sep. 1999, vol. 7, No. 9, pp. 538-539.

Jeong Inho, et al., "Monolithic Implementation of Air-Filled Rectangular Coaxial Line", Electronics Letters, IEE Stevenage, GB, vol. 36, No. 3, Feb. 3, 2000, pp. 228-230.

Kumar, et al., "Features of gold having micrometer to centimeter dimensions can be formed through a combination of stamping with an elastomeric stamp . . . " Appln. Phys. Lett., Jul. 1993, 63(14):2002-2004.

Madden, John D. et al., "Three-Dimensional Microfabrication by Localized, Electrochemical Deposition", J. of Micro. Sys., Mar. 1996, 5(1):24-32.

(56) References Cited

OTHER PUBLICATIONS

Marques, et al., "Fabrication of High-Aspect-Ratio Microstructures on Planar and Nonplanar Surfaces Using a Modified LIGA Process", Dec. 1997, 6(4):329-336.
Muegge—Industrial Microwave +Plasma Systems, "Plasma Stripping Tool", Brochure and Cover, Jan. 24, 2017, 3 pages.
Osterberg, Peter M., et al., "MEMBUILDER: An Automated 3D Solid Model Construction Program For Microelectromechanical Structures", The 8th Int'l Conference on Solid-State Sensors and Actuators, and Eurosensors IX; Jun. 25-29, 1995; pp. 21-24; Stockholm, Sweden.
Taylor, et al., "'Spatial Forming' A Three Dimensional Printing Process", IEEE, 1995, pp. 203-208.

\* cited by examiner

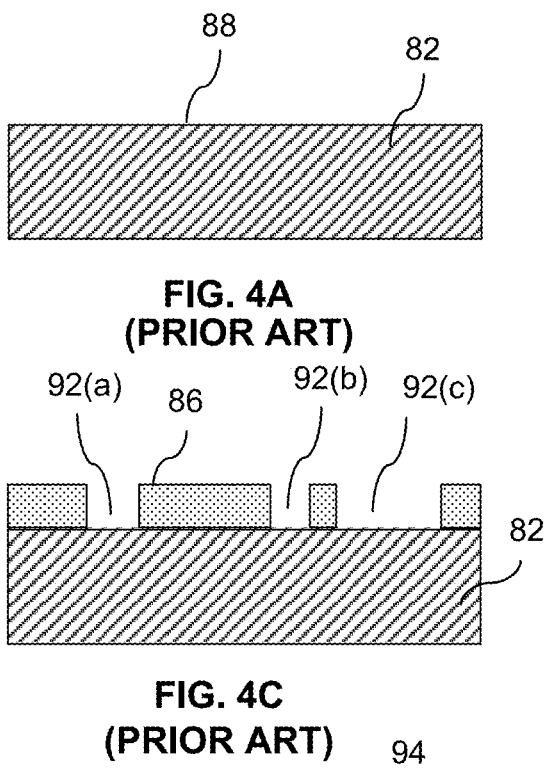
FIG. 4A (PRIOR ART)
FIG. 4C (PRIOR ART)
FIG. 4E (PRIOR ART)
FIG. 4G (PRIOR ART)
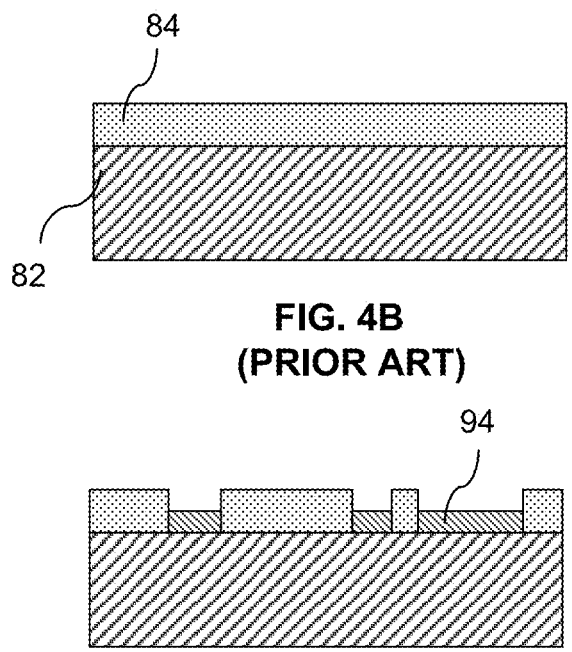
FIG. 4B (PRIOR ART)
FIG. 4D (PRIOR ART)
FIG. 4F (PRIOR ART)
FIG. 4H (PRIOR ART)
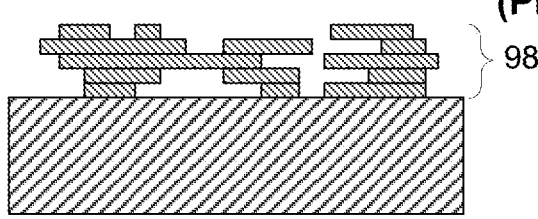
FIG. 4I (PRIOR ART)

NEUTRAL RADICAL ETCHING OF DIELECTRIC SACRIFICIAL MATERIAL FROM REENTRANT MULTI-LAYER METAL STRUCTURES

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| application Ser. No. | Continuity Type | application Ser. No. | Which was Filed (YYYY-MM-DD) | Which is now | Which issued on |
|---|---|---|---|---|---|
| This application | claims benefit of | 62/194,054 | 2015-07-17 | pending | — |
| This application | is a CIP of | 14/676,716 | 2015-04-01 | pending | — |
| 14/676,716 | is a CNT of | 14/203,409 | 2014-03-10 | pending | — |
| 14/203,409 | is a CNT of | 13/206,133 | 2011-08-09 | abandoned | — |
| 13/206,133 | is a CNT of | 12/479,638 | 2009-06-05 | abandoned | — |
| 12/479,638 | is a DIV of | 10/841,272 | 2004-05-07 | abandoned | — |
| 10/841,272 | claims benefit of | 60/468,741 | 2003-05-07 | abandoned | — |
| 10/841,272 | claims benefit of | 60/474,625 | 2003-05-29 | abandoned | — |

FIELD OF THE INVENTION

The present invention relates generally to the field of fabricating reentrant multi-layer three dimensional (e.g. micro-scale or millimeter-scale) structures, parts, components, or devices where each layer is formed from a plurality of deposited materials and more specifically where each layer is formed from at least one metal structural material and at least one polymer-like sacrificial material that are co-planarized and at least a portion of the sacrificial material located on a plurality of layers is removed after formation of the plurality of layers via one or more plasma or neutral radical etching operations.

Background of the Invention

Electrochemical Fabrication:

An electrochemical fabrication technique for forming three-dimensional structures from a plurality of adhered layers is being commercially pursued by Microfabrica® Inc. (formerly MEMGen Corporation) of Van Nuys, Calif. under the name Mica Freeform® (formerly EFAB®).

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.

2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps or in other implementations (batch processes) multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer, or (3) a previously deposited material forming a portion of the given layer that is being created. The pressing together of the CC mask and relevant substrate, layer, or material in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C.

The CC mask plating process is distinct from a "through-mask" plating process in that in a through-mask plating process the separation of the masking material from the substrate would occur destructively. Furthermore in a through mask plating process, opening in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned, state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

Summary of the Invention

It is an object of some embodiments of the invention to provide an improved method for forming reentrant multi-layer three-dimensional structures from a plurality of adhered multi-material layers using at least one polymer material as a sacrificial material and removing the polymer material using plasma etching from a plurality of the layers (e.g. photoresists) wherein the sacrificial polymer (e.g. photoresists) becomes part of a plurality of multi-material layers and is removed from a group of the layers after formation of the group.

Other objects and advantages of various embodiments of the invention will be apparent to those of skill in the art upon review of the teachings herein. The various embodiments of the invention, set forth explicitly herein or otherwise ascertained from the teachings herein, may address the above object or alternatively may address some other object ascertained from the teachings herein. It is not necessarily intended that all objects be addressed by any single aspect of the invention even though that may be the case with regard to some aspects.

In a first aspect of the invention a batch method for forming a plurality of three-dimensional structures, includes: (A) forming a plurality of successively formed multi-material layers, wherein each successive multi-material layer comprises at least two materials and is formed on and adhered to a previously formed multi-material layer, one of the at least two materials is a structural material and the other of the at least two materials is a sacrificial material, and wherein each successive multi-material layer defines a successive cross-section of the plurality of three-dimensional structures, and wherein the forming of each of the plurality of successive multi-material layers includes: (i) depositing a first of the at least two materials; (ii) depositing a second of the at least two materials; (iii) planarizing the first and second materials to set a boundary level for the multi-material layer; and wherein the forming of a given one or more of the plurality of successively formed multi-material layers includes: (i) applying a first patternable mold material (PMM) of portion of which will formed a sacrificial material portion of the multi-material layer; (ii) patterning the first PMM to form a first pattern of sacrificial material; (iii) depositing a structural material in openings in the first pattern of sacrificial material; (iv) planarizing the sacrificial material and the structural material to set a boundary level for the given multi-material layer; and (B) after the forming of the plurality of successive multi-material layers, separating at least a portion of the sacrificial material from multiple multi-material layers of the structural material via plasma etching.

Numerous variations of the first aspect of the invention are possible and include for example: (1) the PMM being a polymer; (2) the PMM being a photoresist; (3) the PMM being a dielectric; (4) the PMM being a conductive epoxy; (5) the PMM being coated, at least in part, with a conductive material prior to depositing the structural material for the given one or more multi-material layer; (6) the $5^{th}$ variation wherein the conductive material includes a seed layer; (7) the $6^{th}$ variation wherein the conductive material includes an adhesion layer; (8) the $1^{st}$ aspect and any of the $1^{st}$-$7^{th}$ variations wherein after formation of a selected multi-material layer but prior to the completion of the formation of all multi-material layers at least one intermediate release operation is performed to release at least selected regions of the sacrificial material from multiple multi-material layers including at least one reentrant region existing under the selected layer and thereafter depositing a second sacrificial material and thereafter forming at least one additional multi-material layer above the selected layer and the second sacrificial material; (9) the $1^{st}$ aspect and any of the $1^{st}$-$8^{th}$ variations wherein the second sacrificial material does not fill all reentrant features where the first sacrificial material was removed (10) either of the $8^{th}$ or $9^{th}$ variation wherein the second sacrificial material is easier to remove than the first sacrificial material by the plasma etching; (11) either of the $9^{th}$ to $10^{th}$ variations wherein the structural material of the selected layer provides a feature selected from the group consisting of (a) a reentrant feature with an R-factor greater than 5, (b) a reentrant feature with a R-factor greater than 10, (c) a reentrant feature with a R-factor greater than 20, and (d) a reentrant feature with a R-factor greater than 50; (12) any of the $8^{th}$-$11^{th}$ variations wherein a multi-material layer above the selected layer contains structural material that provides a feature selected from the group consisting of (a) a reentrant feature with an R-factor greater than 5, (b) a reentrant feature with a R-factor greater than 10, (c) a reentrant feature with a R-factor greater than 20, and (d) a reentrant feature with a R-factor greater than 50; (13) the $1^{st}$ aspect and any of the $1^{st}$-$12^{th}$ variations wherein the structure includes one or more reentrant features having an R-factor selected from the group consisting of (1) greater than 5, (2) greater than 10, (3) greater than 20, and (4) greater than 50; (14) the plasma etching substantially is limited to etching with radicals; (15) the $14^{th}$ variation wherein the radicals include radicals from $O_2$; (16) the 14th variation wherein the radicals are produced from $CF_4$; (17) the $14^{th}$ variation wherein the radicals are produced from $NF_3$; (18) the $1^{st}$ aspect and any of the $1^{st}$-$17^{th}$ variations wherein the etching occurs in a sub-atmospheric pressure chamber; (19) the $1^{st}$ aspect and any of the $1^{st}$-$18^{th}$ variations wherein one or more additional cleaning steps are performed after the plasma etching; (20) the $1^{st}$ aspect and any of the $1^{st}$-$19^{th}$ variations wherein the structural material includes at least one metal; (21) the $20^{th}$ variation wherein the structural material comprises at least two different metals; (22) the $1^{st}$ aspect and any of the 1st-$21^{st}$ variations wherein the two different metals are deposited on two different multi-material layers; (23) the $21^{st}$ variation wherein the two different metals are deposited as part of the same multi-material layer; (24) the $1^{st}$ aspect and any of the $1^{st}$-$23^{th}$ variations wherein the sacrificial material on at least a portion of the plurality of multi-material layers comprises SU-8:

(25) the $1^{st}$ aspect and any of the $1^{st}$-$24^{th}$ variations wherein formation of a particular multi-material layer includes the formation of a non-planar seed layer when structural material forming part of the particular multi-material layer overlays material other than metal structural material on an immediately preceding multi-material layer; (26) the $1^{st}$ aspect and any of the $1^{st}$-$24^{th}$ variations wherein multi-material layer formation comprises the formation of a planar seed layer when structural material forming part of the particular multi-material layer overlays material other than metal structural material on an immediately preceding multi-material layer; (27) the $1^{st}$ aspect and any of the $1^{st}$-$24^{th}$ variations wherein plasma etching comprises at least two etching operations which are separated by at least one non-plasma etching operation; (28) the $1^{st}$ aspect and any of the $1^{st}$ to $26^{th}$ variations wherein the removing includes a non-plasma etching operation as well as the plasma etching; (29) the $1^{st}$ aspect and any of the $1^{st}$ to $28^{th}$ variations wherein at least one of the depositing steps comprises electroplating; (30) the $29^{th}$ variation wherein the depositing of the structural material comprises electroplating; (31) the $1^{st}$ aspect and any of the $1^{st}$ to $30^{th}$ variations wherein the given one or more multi-material layers comprise a number of multi-material layers selected from the group consisting of: (a) at least two multi-material layers; (b) at least three multi-material layers; (c) a plurality of multi-material layers but less than all multi-material layers, (d) at least one half of the multi-material layers, (e) at least two thirds of the multi-material layers; and (f) all of the multi-material layers; (32) the $1^{st}$ aspect and any of the $1^{st}$ to $31^{st}$ variations wherein the structures are selected from the group consisting of (a) horizontally or vertically complex multilayer three-dimensional structures, (b) horizontally or vertically moderately complex multilayer three-dimensional structures, (c) horizontally or vertically highly complex multilayer three-dimensional structures, (d) Reentrant multi-layer three-dimensional structures, and (e) R-Factor extended reentrant multi-layer three-dimensional structures with R factors greater than two.

In a second aspect of the invention a method for the batch formation of a plurality of multi-layer structures, includes: (a) successively forming a plurality of multi-material layers, wherein each successive multi-material layer is formed on an adhered to a preceding multi-material layer, and wherein each of the plurality of multi-material layers comprises both a structural material and a sacrificial material; and (b) after forming the plurality of adhered multi-material layers, removing the sacrificial material from the plurality of plurality of multi-material layers to leave a multi-layer structure comprising the structural material, wherein the multi-layer structure comprises at least one reentrant feature, and wherein the sacrificial material comprises an organic material that is removed at least in part by plasma etching.

Numerous variations of the second aspect of the invention are possible and include for example the variations set forth for the $1^{st}$ aspect of the invention, mutatis mutandis.

The disclosure of the present invention provides various embodiments for the batch formation of multi-layer three-dimensional structures with each successive layer comprising at least two materials, one of which is a metal structural material and the other of which is an organic sacrificial material (e.g. a polymer or a solidified photoresist), and wherein each successively stacked and adhered layer defines a successive cross-section of the three-dimensional structure, and wherein the forming of each of the plurality of successive layers includes: (i) depositing a first of the at least two materials; (ii) depositing a second of the at least two materials; (iii) planarizing the deposited materials that form the layer to set a boundary level for the layer; and (B) after the forming of a plurality of successive layers, separating at least a portion of the sacrificial material, comprising an organic material, e.g. a polymer or solidified photoresist, from the structural material to reveal the three-dimensional structure, wherein the improvement includes: etching the sacrificial organic material from the metal structural material using a plasma etching process.

Other aspects of the invention will be understood by those of skill in the art upon review of the teachings herein. Other aspects of the invention may involve apparatus that can be used in implementing one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 4A-4F schematically depict the formation of a first layer of a structure using adhered mask plating where the blanket deposition of a second material overlays both the openings between deposition locations of a first material and the first material itself FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

DETAILED DESCRIPTION OF PREFERRED EMBODIMENTS

Electrochemical Fabrication in General

Figure 1A:
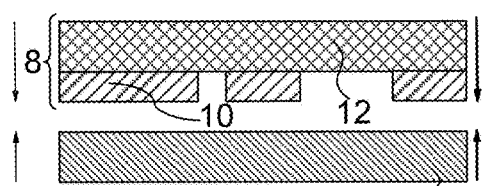
FIGS. 1A-1C schematically depict side views of various stages of a CC mask plating process, while FIGS. 1D-1G schematically depict a side views of various stages of a CC mask plating process using a different type of CC mask.
Figure 1B:
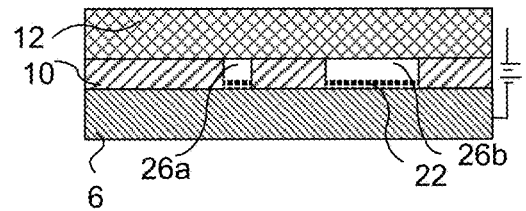
Figure 1C:
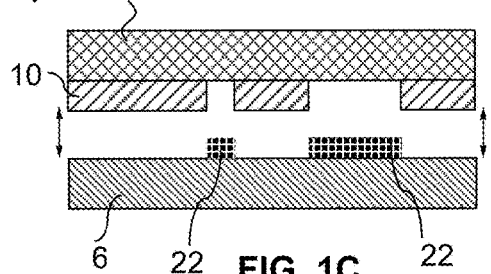
Figure 1D:
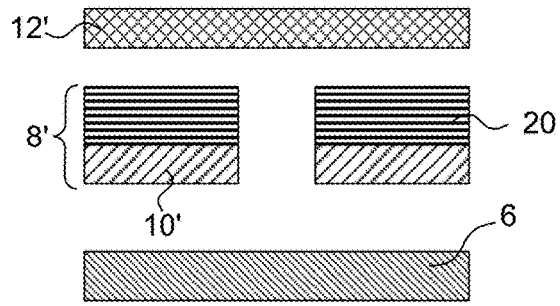
Figure 1E:
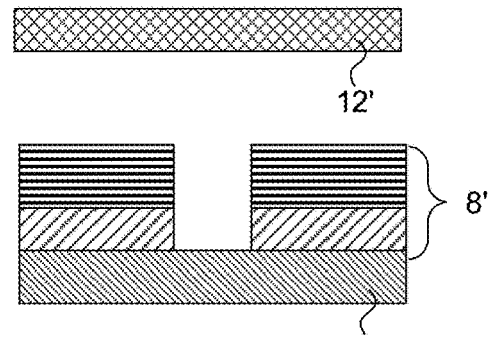
Figure 1F:
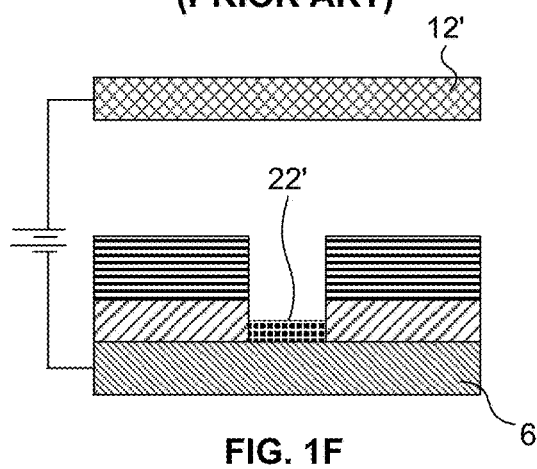
Figure 1G:
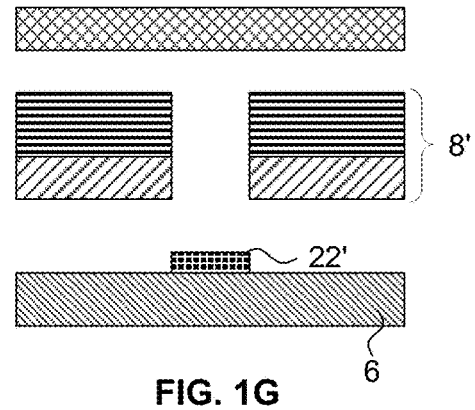
Figure 2A:
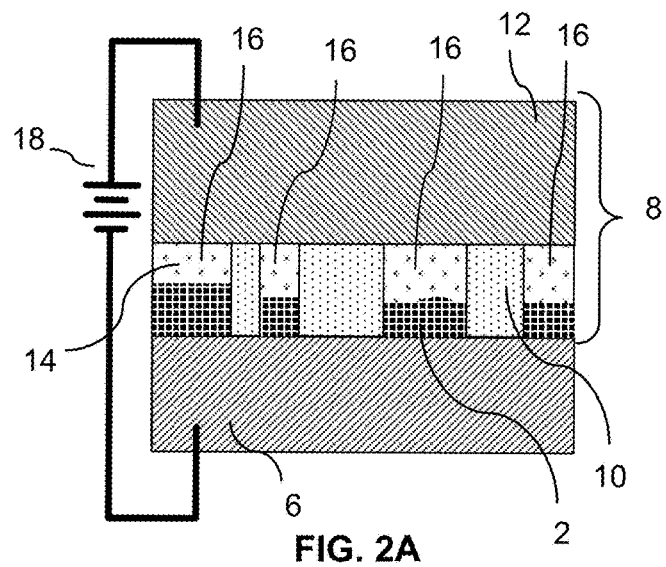
FIGS. 2A-2F schematically depict side views of various stages of an electrochemical fabrication process as applied to the formation of a particular structure where a sacrificial material is selectively deposited while a structural material is blanket deposited.
Figure 2B:
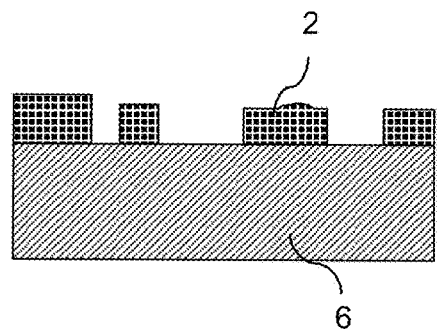
Figure 2C:
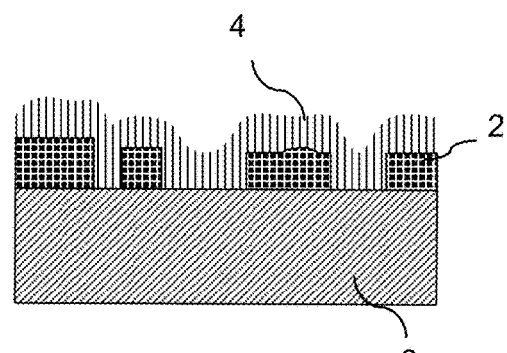
Figure 2D:
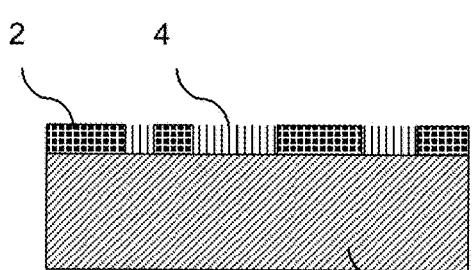
Figure 2E:
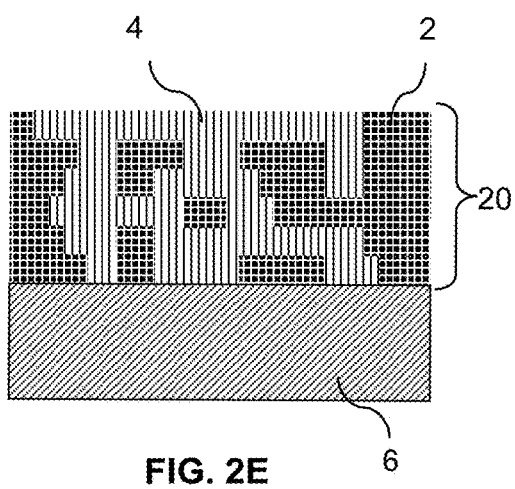
Figure 2F:
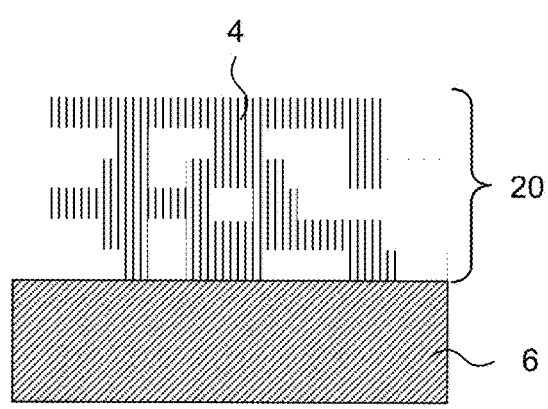
Figure 3A:
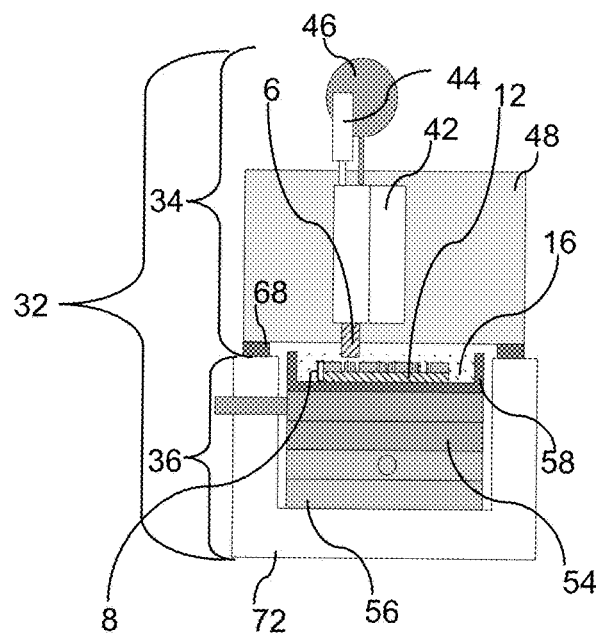
FIGS. 3A-3C schematically depict side views of various example subassemblies that may be used in manually implementing the electrochemical fabrication method depicted in FIGS. 2A-2F.
Figure 3B:
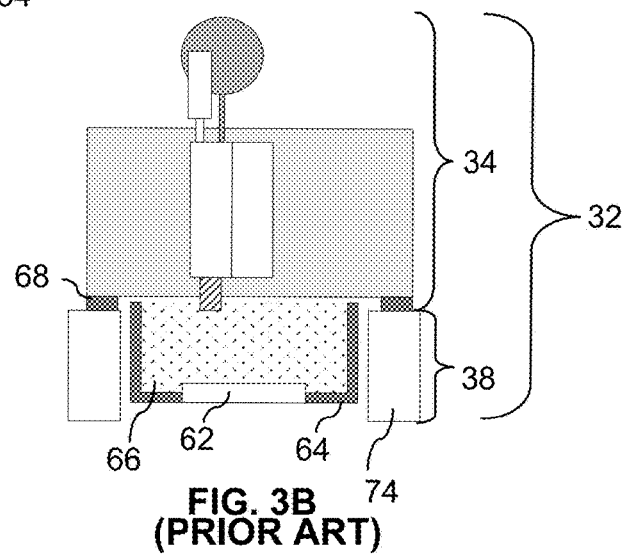
Figure 3C:
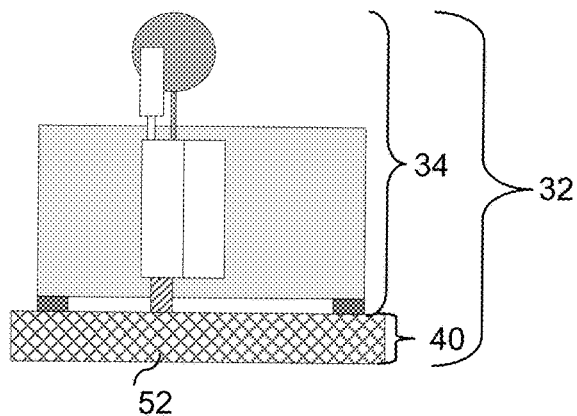

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various other embodiments or various aspects of the invention to yield enhanced embodiments. Still other embodiments may be derived from mixing and matching element and steps into new of combinations based on the various embodiments explicitly set forth herein.

FIGS. 4A-4I illustrate sides views of various states in an alternative multi-layer, multi-material electrochemical fabrication process. FIGS. 4A-4G illustrate various stages in the formation of a single layer of a multi-layer fabrication process where a second metal is deposited on a first metal as well as in openings in the first metal so that the first and second metal form part of the layer. In FIG. 4A a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some, or all, of which may be electrodeposited (as illustrated in FIGS. 1A-4I) or electroless deposited. Some of these structures may be formed from a single build level formed from one or more deposited materials while others are formed from a plurality of build layers each including at least two materials (e.g. two or more layers, more preferably five or more layers, and most preferably ten or more layers). In some embodiments micro-scale structures may be formed wherein layer thicknesses may be as small as one micron (1 um) or as large as fifty microns (50 um). In other embodiments, thinner layers may be used while in other embodiments, thicker layers may be used. In some embodiments micro-scale structures may have features positioned with micron level precision (i.e. 0.1-5 microns) or smaller and minimum features size on the order of microns to tens of microns (i.e. 5-50 microns). Such micro-scale structures may have dimensions that extend from a few tens of microns to tens of millimeters (e.g. 10 ums to 10 millimeters. In other embodiments structures with less precise feature placement and/or larger minimum features may be formed. In still other embodiments, higher precision and smaller minimum feature sizes may be desirable. In the present application meso-scale and millimeter scale have the same meaning and refer to structures or devices that may have one or more dimensions extending into the 0.5-20 millimeter range, or somewhat larger and with features positioned with precision in the 10-100 micron range and with minimum features sizes on the order of 100-500 microns.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration) . Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

In still other embodiments other methods may be used to create and pattern layers. Such alternative techniques may for example involve the use of sheets of material that are applied to previously formed layers wherein the sheets are patterned after deposition by selective etching, wet or dry, laser cutting or ablation, EDM processes, or the like. In other alternative embodiments, deposits of structural or sacrificial materials may be patterned using similar methods.

In some embodiments, structures, multi-component devices or assemblies may be built one at a time while in other embodiments (e.g. batch embodiments) multiple identical or dissimilar structures or devices may be formed simultaneously (e.g. tens of structures, hundreds of structures, thousands, or even tens of thousands of structures). Structures may be formed on substrates such as round substrates that are smaller than one inch in diameter to larger than eight or even twelve inches or more in diameter.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference. Alternatives expressed in the following definitions may be used in creating various alternative embodiments of the invention and it is intended that all combinations of such alternatives be considered as contemplated and taught herein.

"Build" as used herein refers, as a verb, to the process of building a desired structure (or part) plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" or "lateral" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example, they may be defined by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). As another example, they may be defined by levels at which process steps or operations are repeated. As still a further example, they may defined, at least theoretically, as the vertical levels at which lateral extents of structural materials are changed to define new cross-sectional features of a structure.

"Multi-material layer" as used herein refers to a build layer that includes multiple materials which typically includes at least one sacrificial material and at least one structural material located in different lateral region of the layer. Sometimes as used herein a multi-material layer may be referred to simply as a layer or a build layer (e.g. see the last word of the last sentence) and from the context it will generally be clear as to what type of layer is being referred. In cases where the absolute clarity is not possible from the context then all possibilities are to be considered as explicitly set forth as independent options though some may have less utility or relevance.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer height or boundary level). For example, lapping removes material in a substantially non-selective manner though some amount of recession of one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to a one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. Photoresists that may be used to allow patterned deposition of one or more subsequently applied materials and that stay in place during the formation of at least two layers (and more preferably at least three layers) may be considered sacrificial materials (e.g. unless excluded by more restrictive limitations, photoresists or other photo patternable materials that stay in place during formation of a given layer and thereafter such that material of a subsequent layer is formed thereon may be considered a sacrificial material). Such photoresists or other polymers that are considered sacrificial materials will generally undergo layer-by-layer planarization along with structural materials. Photoresists or other polymeric or organic materials that are deposited in a multi-layer fashion to occupy regions of a plurality of layers which initially included use of a different sacrificial material may be considered sacrificial materials. These separation processes are sometimes referred to as a release process and may or may not involve the separation of structural material from a build substrate (e.g. via a release layer of a sacrificial material). In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. During release or separation, sacrificial material is typically removed via a chemical etching operation (e.g. a wet isotropic chemical etching operation that attacks exposed sacrificial material but not structural material to any appreciable level. In some embodiments it may be removed via a melting operation, electrochemical etching operation, laser ablation, or the like. In the present invention at least a portion of an organic sacrificial material (e.g. polymeric material, negative or positive photoresist material) is removed via some form dry etching (e.g. plasma etching via reaction of an organic or even some metallic materials with either plasma or radicals that may have been initially created by a plasma, or by radical etching where the radicals are created by radiation exposure or other non-plasma based methods). In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal and in some case features that have been beneficially modified (e.g. layers with stair steps in regions where smooth sloped surfaces are desired). In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material, such as a metal, though in some embodiments it may be a dielectric material and even a photoresist material. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary sacrificial materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns or less). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either an additional sacrificial material or structural material as part of a current layer or (2) prior to beginning formation of the next layer or they may remain in place through the layer build up process and then be etched away after formation of a plurality of build layers (e.g. as either part of a single release process, part of a multi-step release process that alternately removes sacrificial material and these adhesion, seed or barrier layer materials, or as part of some other multi-step release process.

"Masking material" is a material that may be used as a tool in the process of forming a build layer but does not generally form part of that build layer. Masking material is typically a photopolymer or photoresist material (e.g. a photo-patternable material) or other material that may be readily patterned. Masking material is typically a dielectric. Masking material, though typically sacrificial in nature, is not a sacrificial material as the term is used herein unless certain requirements are met. Masking material is typically applied to a surface during the formation of a build layer for the purpose of allowing selective deposition, etching, or other treatment and is removed either during the process of forming that build layer or immediately after the formation of that build layer. In the embodiments herein, masking material or photo patternable material may or may not function as a sacrificial material.

"Multilayer structures" are structures formed from multiple build layers of deposited or applied materials.

"Multilayer three-dimensional (or 3D or 3-D) structures" are multilayer structures wherein the structural material portions of at least two successive layers are not identical in configuration, not identical in lateral position, or not identical in orientation (i.e. the structural materials on the two successive layers do not completely overlap on another.

Reentrant multi-layer three-dimensional structures are multi-layer three-dimensional structures where structural material of a subsequent layer covers an area of sacrificial material of a previous layer. In other words, a structural material on a subsequent layer that occupies a lateral position different from that of structural material on a previous layer, will form an up-facing feature from material on the preceding layer that is not overlaid by structural material and/or will have a down-facing feature on its underside, where there is no immediately underlying structural material. Such a down-facing feature for the purpose of this application defines a reentrant feature.

"R-Factor extended reentrant multi-layer three-dimensional structures" are reentrant multi-layer three-dimensional structures where structural material of a single subsequent layer, a selected portion of the subsequent layer, or a plurality of subsequent layers or selected portions thereof taken in combination, provide a structural material cover over a region or volume of sacrificial material of a single previous layer, or of plurality of previous layers taken in combination, where the region may be defined to have and R-Factor defined by $$R\text{-Factor} = (THCA + HAA)/(HAA + VAA)$$

where

THCA=Total Horizontal Coverage Area=The horizontal area (having a normal parallel to the build axis (e.g. Z-axis) is defined by the union of areas of coverage provided by structural material of one or more subsequent layers or layer portions that are to be considered. In some implementations, a sum of down-facing areas of the relevant structural material regions may be used to define the THCA.

HAA=Horizontal Access Area=The effective area of horizontal openings within the THCA VAA=Vertical Access Area=The effective area of vertical openings (having a normal perpendicular to the build axis) extending downward from the structural material of the one or more subsequent layers.

The effective areas noted above may be less than the actual areas due to the presence of regions of structural material that are not located on the horizontal surface or vertical surfaces themselves but are located such that they can inhibit or reduce etchant access. The larger the R-Factor the more difficult for etchants (e.g. radicals from $CF_4$ and $O_2$) to access and remove material from reentrant regions). R-factors may, for example, range from 0 (i.e. no coverage) to 1 (coverage and access have approximately equal extents), 2, 5, 10, 20, 50, 100, 200, 500 or even more.

"Complex multilayer three-dimensional (or 3D or 3-D) structures" are multilayer three-dimensional structures formed from at least three layers where a line may be defined that hypothetically extends vertically through at least some portion of the build layers of the structure and that extends from structural material through sacrificial material and back through structural material or extends from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one of structural material or void (when the sacrificial material is removed) to the other of void or structural material and then back to structural material or void as the line is traversed along its length. Complex multi-layer three-dimensional structures may be further defined as either vertically or horizontally complex when such distinction is important.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally. Highly complex multi-layer three-dimensional structures may be further defined as either vertically or horizontally highly complex when such distinction is important.

"Highly complex multilayer (or 3D or 3-D) structures are complex multilayer 3D structures for which the structure-to-void-to-structure or void-to-structure-to-void alternating occurs not only once along the line but occurs a plurality of times along a definable horizontally or vertically extending line. Highly complex multi-layer three-dimensional structures may be further defined as either vertically or horizontally highly complex when such distinction is important.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g. in producing a filter element) the failure to produce a certain number of desired features (e.g. 20-40% failure may be acceptable while in an electrostatic actuator the failure to produce a single small space between two moveable electrodes may result in failure of the entire device. The MFS, for example, may be defined as the minimum width of a narrow and processing element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

Formation and Release Examples:

Multi-layer three-dimensional structures may be formed in a variety of different ways according to different embodiments of the invention. Examples of such embodiments and variations include the various methods for incorporating dielectrics and metals as taught in U.S. patent application Ser. Nos. 14/185,613; 11/478,934; 10/607,931; 14/203,409; and 11/478,934 which are hereby incorporated herein by reference. Other methods may use the teachings of U.S. patent application Ser. No. 14/154,119 regarding the formation of structures using HTED materials. Still other embodiments may use the multi-structural material methods set forth in these applications as well as in the various additional applications that are incorporated herein by reference.

In a first embodiment, a multi-layer three-dimensional structure is formed from a plurality of adhered multi-material layers where one conductive material is electrodeposited and where a masking material is an organic material and is used as sacrificial material. This embodiment includes four steps that are repeated a plurality of times in forming the multi-layer structure.

The primary operations of this embodiment include (1) forming a mask on the substrate (e.g. an actual substrate, a release layer or barrier layer on a substrate, or a previously formed multi-material layer if the present layer is not the first layer) by depositing and then patterning an organic material, such as photoresist, or by selectively dispensing a masking material from an ink jet device or by transfer plating or the like to a height greater than or equal to the layer thickness of the present layer, (2) depositing a seed layer into the voids in the mask produced from this organic material as well as onto the exposed upper surface of the masking material (e.g. by sputtering and/or electroless deposition), (3) depositing a conductive first material to a height equal to or greater than the layer thickness of the present layer (e.g. via an electrodeposition or possibly an electroless deposition operation) into the voids in the masking material and potentially above the masking material, and (4) planarizing the deposited materials to the height of the present layer to bound the present layer This planarization trims off any excess thickness of the first material and any excess thickness of the mask material as well as the adhesion/seed layer that is located above the masking material. Next, the process repeats operations (1)-(4) one or more times to form a multi-layer structure that includes two materials per layer one of which is the mask material. The operations result in seed layer material only being located in the boundary regions between the conductive first material and the masking material on the present layer and along the layer boundary separating the conductive material between the present layer and any preceding layer. In this implementation, planarization is all that is need to remove the adhesion/seed layer material from unwanted areas. Finally, after layer formation is complete, masking material is removed by plasma etching (e.g. etching with neutral radicals produced by a plasma and then separated from the plasma and allowed to contact the masking material and react with it so as to make primarily gaseous by products that can be removed by vacuum.

Numerous alternatives to the this first embodiment exist and include, for example: (1) eliminating step 2 on those layers where the deposited structural material is deposited only on structural material existing on the previous layer, (2) using the indicated four steps during the formation of some layers but using other steps during formation of other layers, (3) incorporation of additional deposition steps, etching steps, planarization steps (e.g. intermediate planarization operations that planarize to a height above a layer boundary level) to form structures with additional structural or sacrificial materials on some layers, (4) performing some preliminary etching release operations prior to completing layer formation and possibly partially back filling into the voids around the structural material or backfilling completely with a material having different properties, (5) adding additional release operations such as wet etching, (6) adding in cleaning operations using solvents, gas flow, supercritical material flow, or the like, (7) use of activation operations to enhance bonding of deposited materials, (8) formation of single structures one at a time or batch fabrication of a plurality of identical or different structures, (9) formation of structures that have multiple components that may be moveable relative to one another, (10) formation of structures that do not adhere directly to a substrate but which are separated from the substrate by a release layer (which may actually be considered a part of the substrate and even a repairable part of the substrate if the substrate is to be reused) to which the first layer of the structure adheres and which can be used to release the structure from the substrate after formation, (11) of course different shaped structures may be formed, (12) structures may be formed with different numbers of layers, different layer thicknesses, varying layer thicknesses, different materials on some or all layers, and the like, (13) additional processing may be performed to reshape the stair steps generally associated with layer-by-layer fabrication or to improve etching access to reentrant regions either via permanent access features through the structural material or via temporary access features that are filled in with structural material during subsequent layer formation such as the processes or modifications taught in U.S. patent application Ser. Nos. 10/607,931, 10/830,262, and 12/828,274 which are each incorporated herein by reference.

FIGS. 5A-5G provide schematic side cut views of a sample structure (which may be one of many structures being simultaneously formed in a batch process) at various stages of the process of the first embodiment where the structure is being formed from multiple multi-material layers that include a metal structural material, a dielectric sacrificial material (e.g. an organic material such as a photoresist or photopolymer, such as SU-8), and a non-planar seed layer underlying and coating the sidewalls of the structural material wherein the structure is formed directly onto a substrate and stays adhered to the substrate even after release of the structure from sacrificial material wherein the release occurs via a plasma etching operation after the formation of all multi-material layers.

Figure 5A:
FIGS. 5A-5G provide schematic side cut views of a sample structure at various stages of the process of the first embodiment where the structure is being formed from multiple multi-material layers that include a metal structural material, a dielectric sacrificial material (e.g. an organic material such as a photoresist or photopolymer, such as SU-8), and a non-planar seed layer underlying and coating the sidewalls of the structural material wherein the structure is formed directly onto a substrate and stays adhered to the substrate even after release of the structure from sacrificial material wherein the release occurs via a plasma etching operation after the formation of all multi-material layers.

FIG. 5A depicts a substrate 122. This substrate is provided to act as a base on to which successive multi-material layers of the structure will be formed. In some embodiments the substrate may be, for example, a metal, a ceramic (conductive or non-conductive), a plastic, or a semiconductor material with or without active electronic components formed thereon.

Figure 5B:
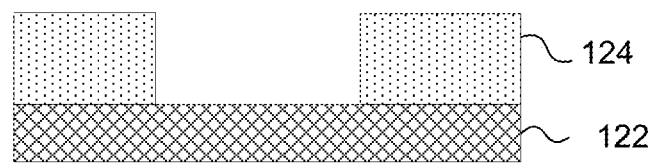

FIG. 5B depicts a mask structure 124 adhered to substrate 122. The mask may, for example, be formed by depositing a photoresist and then using lithography and development to pattern it. In other alternatives the mask may be formed by ink jetting or extruding a material in a desired pattern or by transfer plating and then transforming that material into a solid.

Figure 5C:
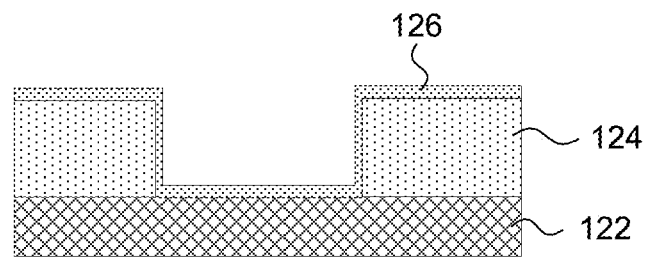

FIG. 5C depicts the state of the process after a seed layer 126 is formed above mask material 124 and substrate 122. The seed layer may be a single metal or it may be a combination of materials such as an adhesion promoter followed by a plating promotor both deposited, for example, by sputtering. In other alternatives a barrier layer may be included to help prevent migration of a conductive structural material to the substrate.

Figure 5D:
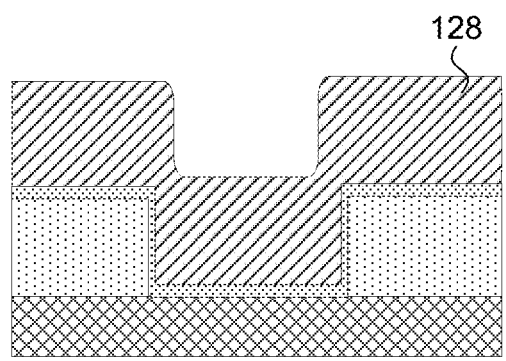
Figure 5E:
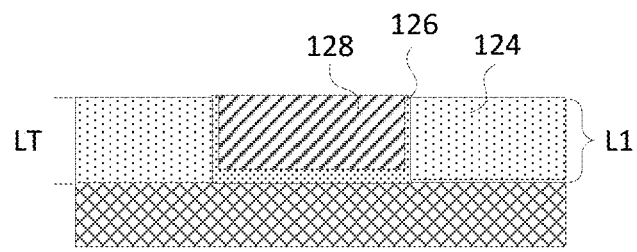

FIG. 5D depicts the state of the process after deposition of a first conductive material 128 (i.e. a structural material) while FIG. 5E depicts the state of the process after planarization of the deposited materials down to a layer thickness LT of the first multi-material layer L1.

Figure 5F:
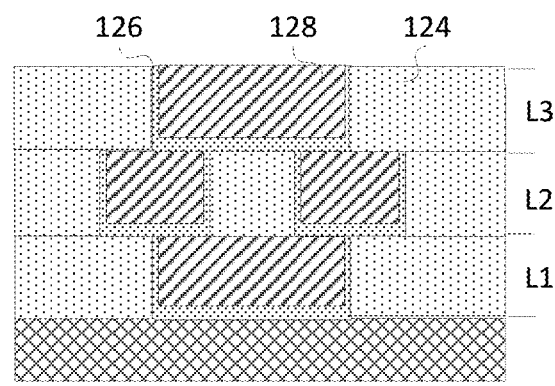

FIG. 5F depicts the state of the process after formation of two additional multi-material layers L2 and L3, where each multi-material layer includes masking material 124, seed layer material 126, and conductive material 128. In this embodiment, the masking material 124 not only functions as a masking material but as a sacrificial material while the conductive material 128 functions as a structural material and more particularly as a primary structural material. In some embodiments these materials may be the same from multi-material layer to multi-material layer, in other embodiments they may differ on some multi-material layers, in still others one or more may not exist on some multi-material layers, while in still others additional materials may exist on some or all multi-material layers.

Figure 5G:
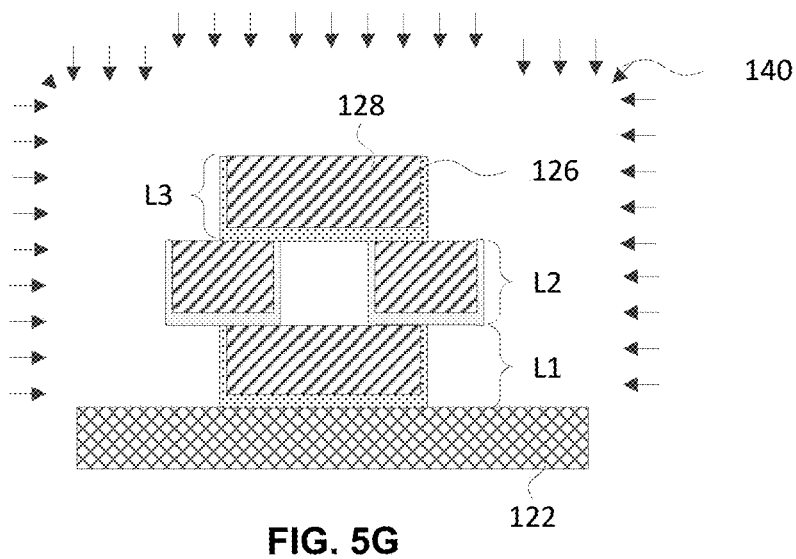

FIG. 5G depicts the state of the process after removal of the masking material by exposure to a plasma etching material (e.g. radicals of $O_2$, $CF_4$, or $NF_3$) as indicated by elements 140 which, as noted above, is also functioning as a sacrificial material and more particularly as a dielectric sacrificial material. In some variations some of the masking material or other dielectric material may be retained as a structural component especially if it is encapsulated by structural material or has a property, attribute, or feature that inhibits it from being removed with the other material (e.g. difficult access path).

FIGS. 6A-6D provide schematic side cut views of a plurality of sample structures at various stages of a process for forming a plurality of structures according to a second embodiment of the invention wherein the structures are formed indirectly on a substrate with an intervening release layer (e.g. a single material layer formed from a material that may be separated from the structural material without damaging the structural material such as, for example an organic sacrificial material or a conductive structural material) and wherein all multi-material layers of the structures are formed prior to releasing the structures from both a sacrificial organic material via a plasma etching operation and from the substrate via a plasma etching operation or via some other operation or operation (such as a wet chemical etching operation).

Figure 6A:
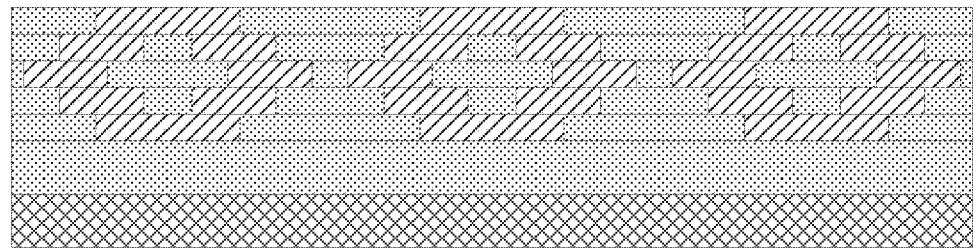
FIGS. 6A-6D provide schematic side cut views of a plurality of sample structures illustrating various stages of a process for forming a plurality of structures according to a second embodiment of the invention wherein the structures are formed indirectly on a substrate with an intervening release layer and wherein all layers of the structures are formed prior to releasing the structures from both a sacrificial organic material via a plasma etching operation and from the substrate via a plasma etching operation, a wet chemical etching operation, or via some other operation or operations.

FIG. 6A shows the state of the process after formation of a release layer on a substrate and five multi-material layers on the release layer and on each other. The multi-material layers, in this example include a metal structural material and a polymeric sacrificial material that may or may not have functioned as a patterning material.

Figure 6B:
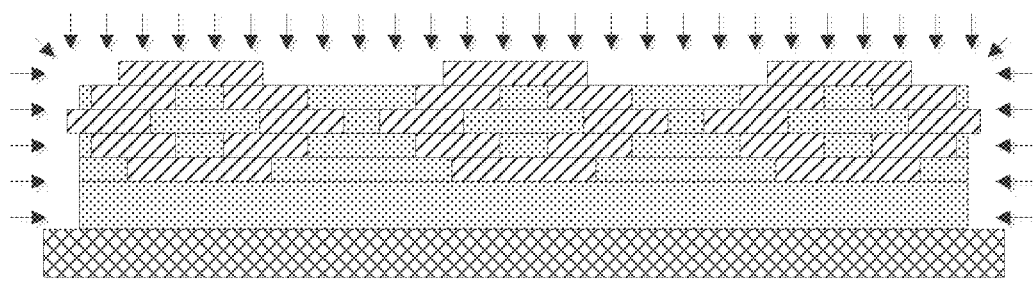
Figure 6C:
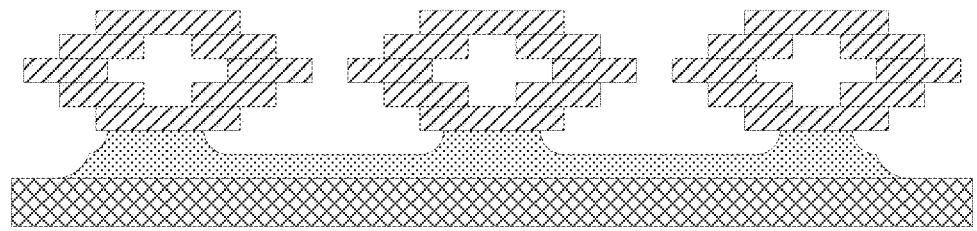

FIG. 6B shows the state of the process after a plasma based release operation or set of operations begins to remove the sacrificial material while FIG. 6C shows the state of the process after most of the sacrificial material is removed. In both FIGS. 6B and 6C a portion of the sacrificial material remains. In FIG. 6B the remaining portion includes both sacrificial material forming part of the multi-material layers and material of the release layer while FIG. 6B has only release material remaining.

Figure 6D:
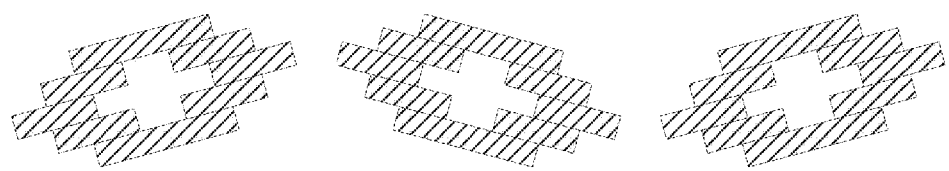

FIG. 6D shows the state of the process after all of the sacrificial material (including material of the release layer) and substrate have been removed.

The embodiment illustrated in FIGS. 6A-6D may be modified in many ways including modifications that incorporate some of the features of the first embodiment or its variations. Likewise the first embodiment may incorporate some of the features of this embodiment.

FIGS. 7A-7G provide schematic side cut views of a plurality of sample structures illustrating various stages in the forming of a plurality of structures according to another embodiment of the invention which includes (1) the partial formation of the structures including formation of a plurality of multi-material layers, (2) an initial release of the partially formed structures from sacrificial material including removal of sacrificial material from undercut or reentrant regions, (3) partial back filling with the same or a different sacrificial material such that some voids remain in the most difficult to access undercut regions, (4) optionally planarizing to set a final boundary level for the last formed multi-material layer, (5) forming the remaining multi-material layers of the structure, and (6) performing a final release of the structural material from multiple layers of sacrificial material and from the substrate wherein the final release is accomplished more readily, or with less damage to the structure, due at least in part to the initial release that occurred. In some alternative embodiments, the partial back filling may be a complete back filling if the initial sacrificial material is replaced with a more readily removable sacrificial material.

Figure 7A:
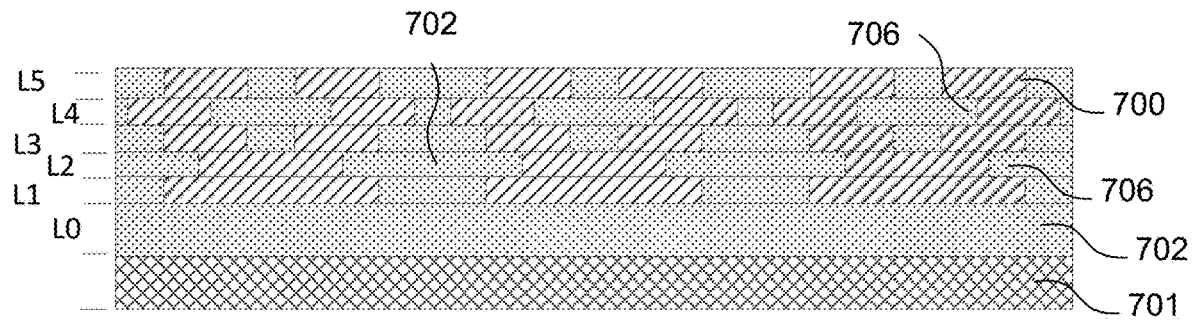
FIGS. 7A-7G provide schematic side cut views of a plurality of sample structures illustrating various stages in the forming of a plurality of structures according to another embodiment of the invention which includes (1) the partial formation of the structures including formation of a plurality of multi-material layers, (2) an initial release of the partially formed structures from sacrificial material including removal of sacrificial material from undercut or reentrant regions, (3) partial back filling with the same or a different sacrificial material such that some voids remain in the most difficult to access undercut regions, (4) optionally planarizing to set a final boundary level for the last formed multi-material layer, (5) forming the remaining multi-material layers of the structure, and (6) performing a final release of the structural material from multiple layers of sacrificial material and from the substrate wherein the final release is accomplished more readily, or with less damage to the structure, due at least in part to the initial release that occurred.

FIG. 7A depicts the state of the process similar to that noted in FIG. 6A with the exception that only a portion of the required multi-material layers have been formed (e.g. multi-material layers 1-n of N) on a substrate 701 which has a release layer LO of sacrificial material over which exists 5 multi-material layers with each have a structural material 700 and a sacrificial material 702. The portion of the layers that have been formed provide, in this example, some undercut or reentrant features 706 and represent a geometry that still provides reasonable access to interior portions of the individual structures but which will experience a significant reduction in access after formation of a next layer. For either of these reasons, stopping layer formation at this point and doing some in situ sacrificial release can be beneficial in terms of overall processing time or less damage to structural material as less material removal will be required later or a simpler removal may be implemented later. In some alternatives the significant reduction in access may not occur after the formation of the immediately succeeding layer but from a subsequent layer that is to be formed. In some alternative embodiments the sacrificial material of the release layer may be different than the sacrificial material of the multi-material layers.

Figure 7B:
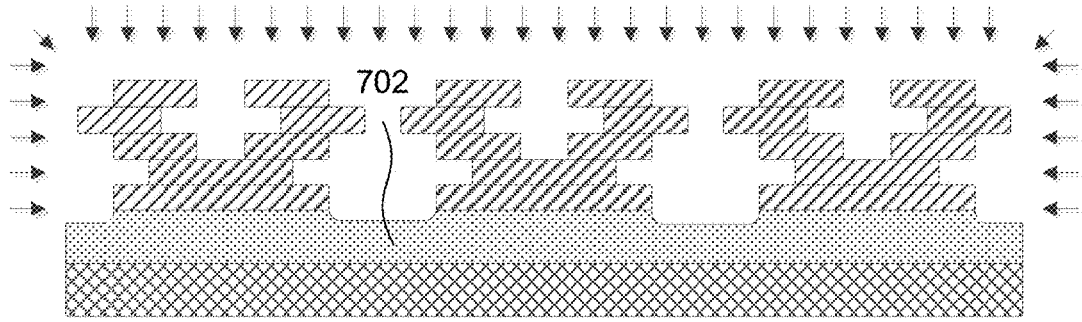

FIG. 7B depicts the state of the process after an etching operation which is depicted with arrows (which may be plasma etching operation or set of operations or some other form of release) has removed the sacrificial material (or at least a desired portion of it).

Figure 7C:
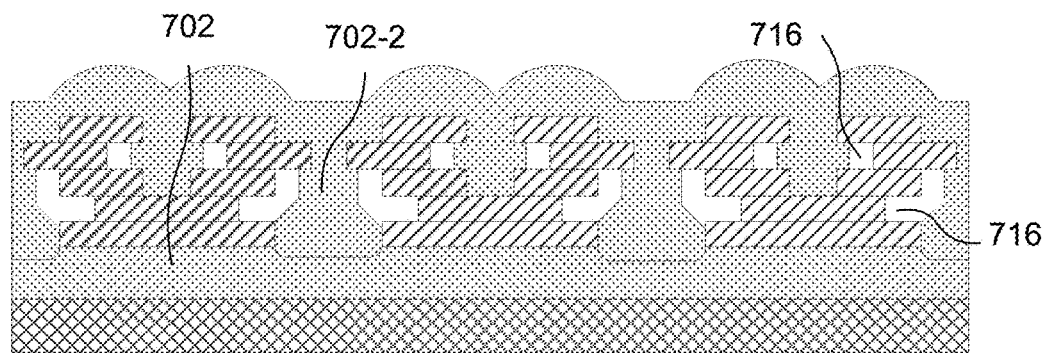

FIG. 7C depicts the state of the process after a back filling of a sacrificial material 702-2 (which may or may not be different from the original sacrificial material 702 that was used) to partially back fill the reentrant features leaving the hardest to reach regions 716 free of sacrificial material. In other alternative embodiments, sacrificial material may refill all portions of the reentrant features but such material may be easier to remove than the original sacrificial material.

Figure 7D:
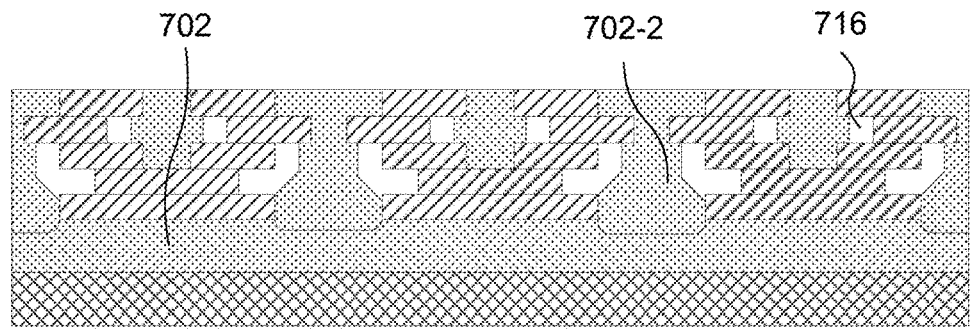

FIG. 7D depicts the state of the process after a planarization or at least smoothing and possibly a cleaning operation prepare the upper surface of the last formed multi-material layer for receiving one or more additional layers. As shown the overlaying sacrificial material is removed and the height of the structural material and the sacrificial material are brought to a common level which matches the desired boundary level of the last formed multi-material layer.

Figure 7E:
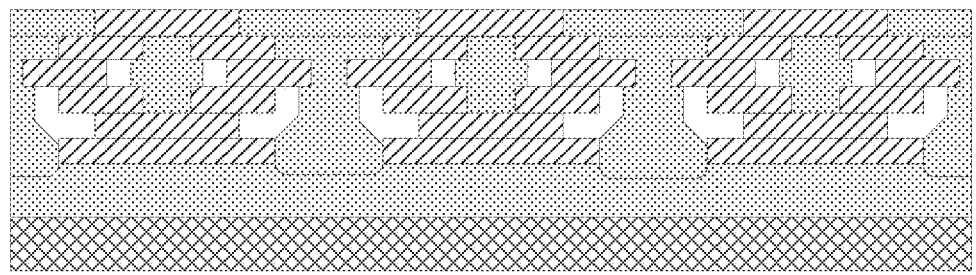
Figure 7F:
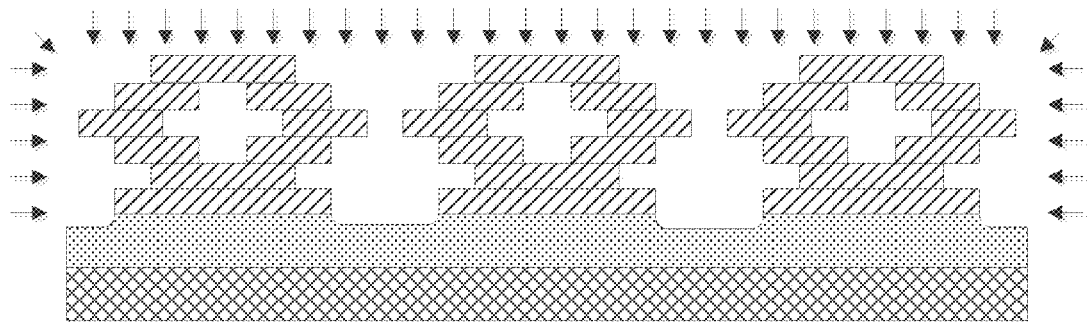
Figure 7G:
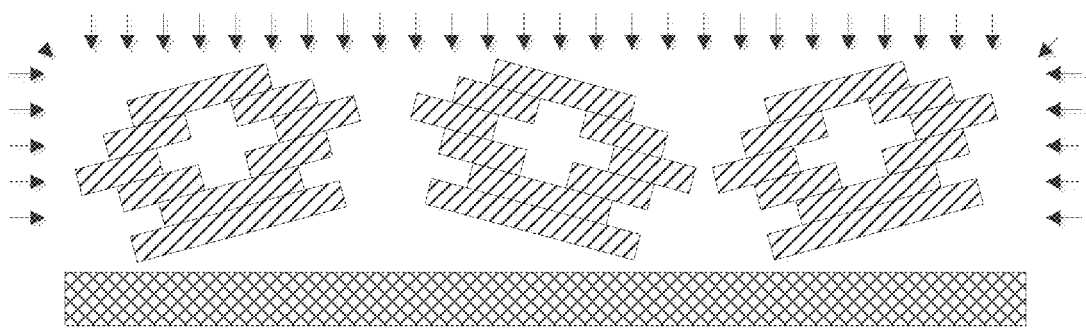

FIG. 7E depicts the state of the process after layer formation is completed while FIG. 7F depicts the state of the process after another etching operation or set of operations is partially performed while FIG. 7G shows the state of the process after complete removal of the sacrificial material and release of the structures from both the sacrificial material and the substrate.

In the embodiment of FIGS. 7A-7G two release etching operations or two sets of etching operations are performed at least one of which is a plasma etching operation (e.g. removal of sacrificial material via reactive non-ionized radicals). In some implementations both sets would be plasma etching operations.

As with the first and second embodiments, numerous variations of the third embodiment are possible and include the variations and features of the first and second embodiments but further include the possibility of performing more than one intermediate etching processes and particularly after or before forming layers that provide significant transitions, such as reentrant features with large R-values or where an upcoming layer would provide a significant reduction in etching access. Other possibilities include using shielding or other etching inhibition techniques to limit regions of etching. In some embodiments, even the last etching operation may use shields or the like to allow selective release of structures.

In some embodiments, plasma etching may be performing using equipment, such as a MUEGGE SU-8 Stripping Tool MA 3000D-161 BB from MUEGGE GMBH of Reichelsheim, Germany.

Further Comments and Conclusions

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

Though the embodiments explicitly set forth herein have considered multi-material layers to be formed one after another. In some embodiments, it is possible to form structures on a layer-by-layer basis but to deviate from a strict planar layer on planar layer build up process in favor of a process that interlaces material between the layers. Such alternative build processes are disclosed in U.S. application Ser. No. 10/434,519, filed on May 7, 2003, now U.S. Pat. No. 7,252,861, entitled Methods of and Apparatus for Electrochemically Fabricating Structures Via Interlaced Layers or Via Selective Etching and Filling of Voids. The techniques disclosed in this referenced application may be combined with the techniques and alternatives set forth explicitly herein to derive additional alternative embodiments. In particular, the structural features are still defined on a planar-layer-by-planar-layer basis but material associated with some layers are formed along with material for other layers such that interlacing of deposited material occurs. Such interlacing may lead to reduced structural distortion during formation or improved interlayer adhesion. This patent application is herein incorporated by reference as if set forth in full.

While various specific embodiments and some variations have been set forth above, numerous other variations are possible. Some such variations may involve the addition of some steps or operations from one embodiment into another embodiment or the replacement of steps in one embodiment by steps from a different embodiment. In some embodiment variations and implementations, structural materials may be electrodepositable materials such as nickel, nickel-cobalt, nickel manganese, nickel phosphor, silver, rhodium, palladium, gold, and/or palladium while in other embodiments other metals, semiconductor materials, or dielectrics may be used which may or may not be electrodepositable. In some embodiments sacrificial material may include one or more metals, such as copper or tin in addition to various dielectrics. In some embodiments material deposition may occur by one or more of electroplating, electroless plating, physical vapor deposition, chemical vapor deposition, spreading, spraying, ink jetting, extruding, fling coating, and the like. In some embodiments additional steps may be used to provide enhanced or improved part formation such as for example, cleaning steps, surface activation steps, alloying steps, diffusion bonding steps, heat treating steps, process tracking steps, temperature, or atmosphere control steps, and the like. In some embodiments, material may be supplied in the form of sheets or powders. In some embodiments, different layers may have different thickness, more than two structural materials may be deposited on any given layer or on different layers and/or more than one sacrificial material may be used on any given layer or on different layers.

In some embodiments, tracking of failed parts may occur manually, or automatically (e.g. by computer/program controlled inspection/test hardware, optics, and/or analysis or comparison methods). For example, parts on a wafer may be examined under manual or computer control of an encoder (X and Y) tracked microscope reticle and when bad parts are identified, a position may be read and manually logged or alternatively, a button may be pressed or other command may be issued that causes the current microscope X & Y position to be automatically recorded as part of a list of bad structures or part positions. The recorded positions may be identified with specific parts and then specific cutting or tethering positions identified.

In some embodiment variations, a computer running a program may be used to correlate the defect locations with the affected parts on the build. In some embodiment variations, part modification locations (e.g. cutting or ablation locations) may be targeted using supplied coordinate data only, coordinate data in combination with optical recognition software and a camera that is viewing the build, feedback between positioning movements, commanded modification locations and detected modifications. In some embodiments, the processes set forth herein may be implemented via multiple independent machines (some or all of which may be manually operated or some or all of which may be computer controlled by programs operating on user supplied data and/or information generated by other system components). In some implementations a single multifunction computer controlled apparatus may be used. In some embodiment variations, modifications may take a number of forms including unambiguously marking the good parts or the bad parts, destroying suspected bad parts or otherwise selected parts (e.g. cutting them in half, in thirds, in fourths, etc.), completely ablating or machining them into non-existence, creating obvious damage that will provide clear and unambiguous indications of which parts are bad (e.g. slotting tips, putting holes in parts, removing any mounting or alignment features, etc.).

The patent applications and patents set forth below are hereby incorporated by reference herein as if set forth in full. The teachings in these incorporated applications can be combined with the teachings set forth directly in these pages and drawings in many ways: For example, enhanced methods of producing structures may be derived from some combinations of teachings, enhanced structures may be obtainable, enhanced apparatus may be derived, devices or components may be obtainable (e.g. from various combinations of structural features of different embodiments or various combinations of materials that give enhanced reliability, that promote easy of assembly, that provide enhanced functionality, or that provide quicker, less expensive, or more automated device fabrication, testing, and the like.

| U.S. patent application Ser. No., Filing Date U.S. application Pub No., Pub Date U.S. Pat. No., Pub Date | Inventor, Title |
|---|---|
| 09/493,496 - Jan. 28, 2000 U.S. Pat. No. 6,790,377 - Sep. 14, 2004 | Cohen, "Method For Electrochemical Fabrication" |
| 10/677,556 - Oct. 1, 2003 2004-0134772 - Jul. 15, 2004 | Cohen, "Monolithic Structures Including Alignment and/or Retention Fixtures for Accepting Components" |
| 10/830,262 - Apr. 21, 2004 2004-0251142A - Dec. 16, 2004 U.S. Pat. No. 7,198,704 - Apr. 3, 2007 | Cohen, "Methods of Reducing Interlayer Discontinuities in Electrochemically Fabricated Three-Dimensional Structures" |
| 10/271,574 - Oct. 15, 2002 2003-0127336A - July 10, 2003 U.S. Pat. No. 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 U.S. Pat. No. 7,235,166 - Jun. 26, 2007 | Cohen, "Multi-cell Masks and Methods and Apparatus for Using Such Masks To Form Three-Dimensional Structures" |
| 10/724,513 - Nov. 26, 2003 2004-0147124 - Jul. 29, 2004 U.S. Pat. No. 7,368,044 - May 6, 2008 | Cohen, "Non-Conformable Masks and Methods and Apparatus for Forming Three-Dimensional Structures" |
| 10/607,931 - Jun. 27, 2003 2004-0140862 - Jul. 22, 2004 U.S. Pat. No. 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 U.S. Pat. No. 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179 A - Dec. 25, 2003 U.S. Pat. No. 7,229,542 Jun. 12, 2007 | Bang, "Methods of and Apparatus for Molding Structures Using Sacrificial Metal Patterns" |
| 10/434,103 - May 7, 2004 2004-0020782A - Feb. 5, 2004 U.S. Pat. No. 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 U.S. Pat. No. 7,252,861 - Aug. 7, 2007 | Smalley, "Methods of and Apparatus for Electrochemically Fabricating Structures Via Interlaced Layers or Via Selective Etching and Filling of Voids" |

| U.S. patent application Ser. No., Filing Date U.S. application Pub No., Pub Date U.S. Pat. No., Pub Date | Inventor, Title |
|---|---|
| 10/724,515 - Nov. 26, 2003 2004-0182716 - Sep. 23, 2004 U.S. Pat. No. 7,291,254 - Nov. 6, 2007 | Cohen, "Method for Electrochemically Forming Structures Including Non-Parallel Mating of Contact Masks and Substrates" |
| 10/841,347 - May 7,2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 U.S. Pat. No. 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 U.S. Pat. No. 7,498,714 - Mar. 3, 2009 | Lockard, "Three-Dimensional Structures Having Feature Sizes Smaller Than a Minimum Feature Size and Methods for Fabricating" |

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings set forth directly herein with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A batch method for forming a plurality of three-dimensional structures simultaneously, comprising:
    (A) forming a plurality of successively formed multi-material layers, wherein each successive multi-material layer comprises at least two materials and is formed on and adhered to a previously formed multi-material layer, wherein one of the at least two materials is a structural material and the other of the at least two materials is a sacrificial material, and wherein each successive multi-material layer defines a successive cross-section of the plurality of three-dimensional structures, and wherein the forming of each of the plurality of successive multi-material layers comprises:
        (i) depositing a first of the at least two materials;
        (ii) depositing a second of the at least two materials;
        (iii) planarizing the first and second materials to set a boundary level for the multi-material layer; and
    wherein the forming of a given one or more of the plurality of successively formed multi-material layers comprises:
        (i) applying a first patternable mold material (PMM), a portion of which forms a sacrificial material portion of the multi-material layer;
        (ii) patterning the first PMM to form a first pattern of sacrificial material;
        (iii) depositing a structural material in openings in the first pattern of sacrificial material;
        (iv) planarizing the sacrificial material and the structural material to set a boundary level for the given multi-material layer; and
    (B) after the forming of the plurality of successive multi-material layers, separating at least a portion of the sacrificial material from multiple multi-material layers of the structural material via an etching operation that is limited to non-ionized radical etching,
    wherein after formation of a selected multi-material layer but prior to the completion of the formation of all multi-material layers at least one intermediate release operation is performed to release at least selected regions of the sacrificial material from multiple multi-material layers including at least one reentrant region existing under the selected layer and thereafter depositing a second sacrificial material and thereafter forming at least one additional multi-material layer above the selected layer and the second sacrificial material.

2. The method of claim 1 wherein the PMM is a material selected from the group consisting of: (1) a polymer, (2) a photoresist, (3) a dielectric, and (4) a conductive epoxy.

3. The method of claim 1 wherein the PMM is coated, at least in part, with a conductive material prior to depositing the structural material for the given one of the plurality of multi-material layers.

4. The method of claim 3 wherein the conductive material provided in preparation for depositing the structural material comprises an adhesion layer.

5. The method of claim 1 wherein the second sacrificial material does not fill all reentrant features where the first sacrificial material was removed.

6. The method of claim 5 wherein the second sacrificial material is easier to remove than the first sacrificial material by the radical etching.

7. The method of claim 5 wherein the structural material of the selected layer provides a feature selected from the group consisting of (1) a reentrant feature with an R-factor greater than 5, (2) a reentrant feature with a R-factor greater than 10, (3) a reentrant feature with a R-factor greater than 20, and (4) a reentrant feature with a R-factor greater than 50.

8. The method of claim 5 wherein a multi-material layer above the selected layer contains structural material that provides a feature selected from the group consisting of (1) a reentrant feature with an R-factor greater than 5, (2) a reentrant feature with a R-factor greater than 10, (3) a reentrant feature with a R-factor greater than 20, and (4) a reentrant feature with a R-factor greater than 50.

9. The method of claim 1 wherein the structure includes at least one reentrant feature having an R-factor selected from the group consisting of (1) greater than 5, (2) greater than 10, (3) greater than 20, and (4) greater than 50.

10. The method of claim 1 wherein the etching occurs in a sub-atmospheric pressure chamber.

11. The method of claim 1 wherein at least one additional cleaning step is performed after the etching.

12. The method of claim 1 wherein the structural material comprises at least one metal.

13. The method of claim 12 wherein the structural material is selected from the group consisting of (1) at least two different metals, (2) at least two different metals deposited on two different multi-material layers, and (3) at least two different metals deposited as part of the same multi-material layer.

14. The method of claim 1 wherein the sacrificial material on at least a portion of the plurality of multi-material layers comprises SU-8.

15. The method of claim 1 wherein the formation of a particular multi-material layer includes formation of a seed layer selected from the group consisting of (1) formation of a non-planar seed layer when structural material forming part of the particular multi-material layer overlays material other than metal structural material on an immediately preceding multi-material layer and (2) formation of a planar seed layer when structural material forming part of the particular multi-material layer overlays material other than metal structural material on an immediately preceding multi-material layer.

16. The method of claim 1 wherein at least one of the depositing steps comprises electroplating.

17. The method of claim 1 wherein the given multi-material layer comprises a number of multi-material layers selected from the group consisting of: (1) at least two multi-material layers; (2) at least three multi-material layers; (3) a plurality of multi-material layers but less than all multi-material layers, (4) at least one half of the multi-material layers, (5) at least two thirds of the multi-material layers; and (6) all of the multi-material layers.

18. The method of claim 1 wherein the structures are selected from the group consisting of (1) horizontally or vertically complex multilayer three-dimensional structures, (2) horizontally or vertically moderately complex multilayer three-dimensional structures, and (3) horizontally or vertically highly complex multilayer three-dimensional structures.

19. A method for the batch formation of a plurality of multi-layer structures, comprising:
   successively forming a plurality of multi-material layers, wherein each successive multi-material layer is formed on and adhered to a preceding multi-material layer, and wherein each of the plurality of multi-material layers comprises both a structural material and a sacrificial material; and
   after forming the plurality of adhered multi-material layers, removing the sacrificial material from the plurality of plurality of multi-material layers to leave a multi-layer structure comprising the structural material, wherein the multi-layer structure comprises at least one reentrant feature,
   wherein the sacrificial material comprises an organic material that is removed by an etching operation that is limited to non-ionized radical etching,
   wherein after formation of a selected multi-material layer but prior to the completion of the formation of all multi-material layers at least one intermediate release operation is performed to release at least selected regions of the sacrificial material from multiple multi-material layers including at least one reentrant region existing under the selected layer and thereafter depositing a second sacrificial material and thereafter forming at least one additional multi-material layer above the selected layer and the second sacrificial material.

20. The method of claim 19 wherein the at least one reentrant feature has an R-factor selected from the group consisting of (1) greater than 5, (2) greater than 10, (3) greater than 20, and (4) greater than 50.

* * * * *